United States Patent
Kenyon et al.

(10) Patent No.: US 11,004,506 B2
(45) Date of Patent: May 11, 2021

(54) SWITCHING RESISTOR AND METHOD OF MAKING SUCH A DEVICE

(71) Applicant: UCL Business LTD, London (GB)

(72) Inventors: Anthony Kenyon, London (GB); Adnan Mehonic, London (GB); Wing Ng, London (GB)

(73) Assignee: UCL Business LTD, London (GB)

( * ) Notice: Subject to any disclaimer, the term of this patent is extended or adjusted under 35 U.S.C. 154(b) by 0 days.

(21) Appl. No.: 16/499,698

(22) PCT Filed: Mar. 29, 2018

(86) PCT No.: PCT/GB2018/050882
§ 371 (c)(1),
(2) Date: Sep. 30, 2019

(87) PCT Pub. No.: WO2018/178720
PCT Pub. Date: Oct. 4, 2018

(65) Prior Publication Data
US 2020/0043550 A1  Feb. 6, 2020

(30) Foreign Application Priority Data

Mar. 31, 2017 (GB) ..................................... 1705210

(51) Int. Cl.
| | | |
|---|---|---|
| G11C 13/00 | (2006.01) | |
| G11C 11/56 | (2006.01) | |
| H01L 45/00 | (2006.01) | |

(52) U.S. Cl.
CPC ...... *G11C 13/0007* (2013.01); *G11C 11/5614* (2013.01); *G11C 11/5685* (2013.01);
(Continued)

(58) Field of Classification Search
None
See application file for complete search history.

(56) References Cited

U.S. PATENT DOCUMENTS

| 10,269,860 B2 | 4/2019 | Ang et al. | |
|---|---|---|---|
| 2005/0180189 A1* | 8/2005 | Happ | ...................... H01L 45/06 365/145 |

(Continued)

FOREIGN PATENT DOCUMENTS

| WO | WO 2011/053297 | 5/2011 |
|---|---|---|
| WO | 2013005040 A1 | 1/2013 |

(Continued)

OTHER PUBLICATIONS

Borghetti et al., ""Memristive" switches enable "stateful" logic operations via material implication," Nature, Letters, vol. 464, Apr. 8, 2010, pp. 873-876.

(Continued)

*Primary Examiner* — Tan T. Nguyen
(74) *Attorney, Agent, or Firm* — Hamilton, Brook, Smith & Reynolds, P.C.

(57) ABSTRACT

A switching resistor has a low resistance state and a high resistance state. The switching resistor comprises a dielectric layer disposed between a first electrode and a second electrode. The switching resistor further comprises a textured boundary surface between the first electrode and the dielectric layer. The textured boundary surface promotes the formation of a conductive pathway in the dielectric layer between the first electrode and the second electrode.

20 Claims, 8 Drawing Sheets

(52) U.S. Cl.
CPC ...... *G11C 13/0011* (2013.01); *G11C 13/0069* (2013.01); *H01L 45/08* (2013.01); *H01L 45/1273* (2013.01); *H01L 45/145* (2013.01); *H01L 45/1625* (2013.01); *G11C 2213/13* (2013.01); *G11C 2213/15* (2013.01); *G11C 2213/33* (2013.01); *G11C 2213/52* (2013.01)

(56) References Cited

U.S. PATENT DOCUMENTS

| | | | |
|---|---|---|---|
| 2006/0044991 A1* | 3/2006 | Nishihara | G11B 7/24038 369/272.1 |
| 2007/0138565 A1* | 6/2007 | Datta | H01L 27/092 257/369 |
| 2011/0242873 A1 | 10/2011 | Bratkovski et al. | |
| 2013/0023105 A1* | 1/2013 | Pramanik | H01L 21/32139 438/381 |
| 2015/0044816 A1* | 2/2015 | Kim | H01L 45/146 438/104 |
| 2015/0162424 A1* | 6/2015 | Briere | H01L 29/42316 257/194 |
| 2017/0032848 A1* | 2/2017 | Chung | H01L 27/11206 |
| 2017/0141306 A1* | 5/2017 | Maikap | H01L 45/1266 |
| 2020/0144496 A1* | 5/2020 | Glassman | |
| 2020/0168793 A1 | 5/2020 | Kenyon et al. | |

FOREIGN PATENT DOCUMENTS

| | | |
|---|---|---|
| WO | WO 2017/018933 | 2/2017 |
| WO | WO 2017/115340 | 7/2017 |
| WO | WO 2018/178720 | 10/2018 |
| WO | WO 2019/016539 | 1/2019 |

OTHER PUBLICATIONS

Chang et al., "Characteristics and Mechanisms of Silicon-Oxide-Based Resistance Random Access Memory," IEEE Electron Device Letters, vol. 34, No. 3, Mar. 2013, pp. 399-401.

Chen et al., "Comprehensive study of intrinsic unipolar SiOx-based ReRAM characteristics in AC frequency response and low voltage (< 2V) operation", 2016 International Symposium on VLSI Technology, Systems and Application (VLSI-TSA), IEEE, Apr. 25, 2016.

Gao et al., "A mechanism for Frenkel defect creation in amorphous $SiO_2$ facilitated by electron injection," Nanotechnology, 27, 2016, 505207, (7pp).

Hohl et al., "An interface clusters mixture model for the structure of amorphous silicon monoxide (SiO)," Journal of Non-Crystalline Solids, 320 (2003), pp. 255-280.

Jana, D., et al., "Rough surface improved formation-free low power resistive switching memory using IrOX/GdOx/W structure", VLSI Technology, Systems and Applications, 2013 International Symposium, IEEE, Apr. 22, 2013, XP032431000.

Jeong et al., "A low-temperature-grown $TiO_2$-based device for the flexible stacked RRAM application", Nanotechnology, IOP, Bristol, GB, vol. 21, No. 11, Mar. 19, 2010, XP020174657.

Jo et al., "Nanoscale Memristor Device as Synapse in Neuromorphic Systems," Nano Lett. 2010, 10, pp. 1297-1301.

Ke, et al., "Surface-Controlled Metal Oxide Resistive Memory", IEEE Electron Device Letters, IEEE Service Center, New York, NY, vol. 36, No. 12, Nov. 20, 2015, XP011590844, [retrieved on Nov. 20, 2015].

Mehonic et al., "Emulating the Electrical Activity of the Neuron Using a Silicon Oxide RRAM cell," Frontiers in Neuroscience, Feb. 2016, vol. 10, Article 57, Feb. 23, 2016.

Mehonic et al., "Resistive switching in silicon suboxide films," Journal of Applied Physics, 111, 074507 (2012).

Mikhaylov et al., "Bipolar resistive switching and charge transport in silicon oxide memristor," Materials Science and Engineering B, 194 (2015) 48-54.

Pennycook et al., "High-resolution Z-contrast imaging of crystals," Ultramicroscopy 37 (1991) 14-38, North-Holland.

Thornton, "The microstructure of sputter-deposited coatings," Journal of Vacuum Science & Technology A 4 (6), Nov./Dec. 1986; https://doi.org/10.116/1.573628, 3059-3065.

Torrezan et al., "Sub-nanoseconf switching of a tantalum oxide memristor," Nanotechnology, 22 (2011) 485203 (7pp).

Wang et al., "Nanoporous Silicon Oxide Memory," Nano Letters, 2014, 14, 4694-4699.

Waser et al., "Nanoionics-based resistive switching memories," Review Articles, Insight, Nature Materials, vol. 6, Nov. 2007, pp. 833-840.

Yan et al., "Superior resistive switching memory and biological synapse properties based on a simple $TiN/SiO_2$/p-Si tunneling junction structure," Journal of Materials Chemistry C, 2017, 5, 2259-2267.

Yao et al., Resistive Switches and Memories from Silicon Oxide, Nano Letters, 2010, 10 4105-4110.

International Search Report for International Application No. PCT/GB2018/050882, entitled "A Switching Resistor and Method of Making Such a Device," dated Aug. 27, 2018.

International Preliminary Report on Patentability for International Application No. PCT/GB2018/050882, entitled "A Switching Resistor and Method of Making Such a Device," dated Oct. 10, 2019.

Chen et al., "HfOx Based Vertical Resistive Random Access Memory for Cost-Effective 3D Cross-Point Architecture without Cell Selector," IEEE, 4 pages (2012).

Choi et al., "Electrical Performance and Scalability of Pt Dispersed $SiO_2$ Nanometallic Resistance Switch," Nano Lett., 13: 3213-3217 (2013).

Di Bartolomeo, "Graphene Schottky diodes: An experimental review of the rectifying graphene/semiconductor heterojunction," Physics Reports 606, pp. 1-58 (2016).

Kvatinsky et al., "Memristor-Based Material Implication (IMPLY) Logic: Design Principles and Methodologies," IEEE Transactions on Very Large Scale Integration (VLSI) Systems, pp. 1-15 (2013).

Lamb, D. R., "A non-filamentary switching action in thermally grown sillicon dioxide films," Brit. J. Appl. Phys., vol. 18., pp. 29-32 (1967).

Mehonic et al., "Structural changes and conductance threshholds in metal-free intrinsic SiOx resistive random access memory," J. Appl. Phys., 117: 124505 (2015).

Mehonic et al., "Electrically tailored resistance switching in silicon oxide," Nanotechnology, 23: 455201: 1-9 (2012).

Montesi et al., "Nanosecond Analog Programming of Substoichiometric Silicon Oxide Resistive RAM," IEEE Transactions on Nanotechnology, IEEE Service Center, Piscataway, NY, vol. 15, No. 3, pp. 428-434 (May 6, 2016), XP011611857.

Pearson et al., "Filamentary Conduction in Semiconducting Glass Diodes,"Appl. Phys. Lett. 14, No. 9, pp. 280-282 (1969).

Southwick, III et al., Stacked Dual-Oxide MOS Energy Band Diagram Visual Representation Program (IRW Student Paper), IEEE Transactions on Device and Materials Reliability, vol. 6, No. 2, pp. 136-145 (2006).

Southwick, III et al., "An Interactive Simulation Tool for Complex Multilayer Dielectric Devices," IEEE Transactions on Device and Materials Reliability, vol. 11, No. 2, (2011).

Strukov, "The missing memristor found," Nature vol. 453, pp. 81-83 (2008).

Sze et al., "Physics of Semiconductor Devices," Physics of Semiconductor Devices, 3rd Edition, pp. 1-763 (2007).

Tappertzhofen et al., "Nanoionic transport and electrochemical reactions in resistively switching silicon dioxide," Nanoscale, 4, pp. 3040-3043 (2012).

Tsai et al., "Origin of Hopping Conduction in Sn-Doped Silicon Oxide RRAM With Supercritical $CO_2$ Fluid Treatment," IEEE Electron Device Letters, vol. 33, No. 12, pp. 1693-1695 (2012).

Vescan et al., "I/V characteristics of epitaxial Schottky Au barrier diode on p+ diamond substrate," Diamond and Related Materials, 4, pp. 661-665 (1995).

Wang, Y., et al., "Memory switching properties of e-beam evaporated SiOx on N++ Si substrate," Appl. Phys. Lett. 100, 083502 (2012).

(56) References Cited

OTHER PUBLICATIONS

Yeo, K. S., et al., "Application of sputter-deposited amorphous and anatase TiO2 as electron-collecting layers in inverted organic photovoltaics," Organic Electronics 14, pp. 1715-1719 (2013).

* cited by examiner (a)

(b)

SWITCHING RESISTOR AND METHOD OF MAKING SUCH A DEVICE

This application is the U.S. National Stage of International Application No. PCT/GB2018/050882, filed Mar. 29, 2018, which designates the U.S., published in English, and claims priority under 35 U.S.C. § 119 or 365(c) to GB Application No. 1705210.1, filed Mar. 31, 2017. The entire teachings of the above applications are incorporated herein by reference.

FIELD

The present invention relates to switching resistors (resistance switches) and to methods for making such a device.

BACKGROUND

As modern computing has expanded from desktop PCs and mainframes towards laptops and mobile devices, demand has increased for space and power efficient memory. However, dynamic random access memory (DRAM) requires constant power to retain its memory state, while flash memory is relatively expensive and has limited lifetime. Given this, recent years have seen renewed interest and research into alternative memory technologies, with resistive random access memory (RRAM) standing as a leading candidate. The resistance of such devices depends on their past history, and typically can be switched between a lower value and a higher value (and back again). Moreover, such two-terminal resistive switching elements (known as switching resistors, memory resistors, or "memristors") have the ability to remember their last resistance state even when no bias voltage is applied and once power has been switched off. This behaviour opens up a wide range of potential applications including memories, and also other areas, such as in neural networks and non-Boolean logic. For example, a non-volatile device exploiting resistance switching, such as RRAM, offers the possibly of low power consumption, high speed switching and high density storage in 3D arrays. Accordingly, non-volatile memories based on resistive (resistance) switching have attracted considerable attention over the past few years.

Switching resistors reported in the literature typically have multilayer structures in which conductive pathways are generated by the application of external fields. Strukov et al, Nature, 453, 80-83, (2008) discloses that titanium dioxide multilayers, in which the spatial distribution of oxygen ions is altered by an applied field, have exhibited memristor behaviour. However, these devices include metal electrodes and have conduction through metal filaments and so are not readily integrated into complementary metal oxide semiconductor (CMOS) fabrication processes.

Redox-based resistive RAM (ReRAM) [1] is viewed as one of the most promising candidates for the next-generation of non-volatile memories owing to its fast switching times, low power consumption, non-volatility and CMOS-compatibility [2, 3]. Other applications include power-efficient systems for neuromorphic engineering [4, 5] and logic [6].

Resistance switching in silicon oxide-based ReRAM devices can result from a number of very different processes. We may divide these into those that are intrinsic properties of the oxide (e.g. valence change RRAM) and those that require the diffusion in of conductive species such as metal ions—we may call these extrinsic processes. In other words, for intrinsic switching, a conductive pathway or filament through a dielectric (e.g. oxide) layer is formed from the material of the dielectric layer itself, whereas for extrinsic switching, such a conductive pathway or filament relies upon the migration of material into the dielectric layer from outside the dieletric layer (typically from one of the electrodes).

The body of the literature on intrinsic resistance switching in silicon oxide is rather limited—a situation that arises from a conventional belief that sub-hard breakdown silicon oxide is an inert electrical insulator. Some literature has even suggested that resistance switching in metal-free silicon oxide is not possible [8]. However, intrinsic switching has indeed been reported. One example of an intrinsic resistance switching effect has been demonstrated on the surface of silicon oxide held under vacuum, see [12] and Wang et al., Appl. Phys. Let. 100, 083502 (2012). However, the vacuum requirement of these devices makes them somewhat unwieldy for practical use. More recently, another intrinsic switching effect has been demonstrated by [9], with the advantage of occurring in bulk silicon dioxide under ambient conditions. Accordingly, such intrinsic switching can generally can be classified into that occurring inside the oxide bulk ("bulk switching"), which depends on oxide microstructure and the availability of oxygen [9-11], while switching at internal pores and edges ("surface switching") of the oxide may only be possible in vacuum or in devices that have been hermetically sealed [12, 13]. Further information about intrinsic, bulk switching can be found, inter alia, in WO 2013/005040.

There is an ongoing interest in trying to improve the operational characteristics of such switching transistors.

SUMMARY

The invention is defined in the appended claims.

As described herein, a switching resistor has a low resistance state and a high resistance state. The switching resistor comprises a dielectric layer disposed between a first electrode and a second electrode. The switching resistor further comprises a textured boundary surface between the first electrode and the dielectric layer. The textured boundary surface promotes the formation of a conductive filament in the dielectric layer between the first electrode and the second electrode.

Also as described herein, a method for making a switching resistor having a low resistance state and a high resistance state includes forming a first electrode; forming a dielectric layer on the first electrode, with a textured boundary surface between the first electrode and the dielectric layer; and forming a second electrode on the dielectric layer. The textured boundary surface acts to promote the formation of a conductive pathway in the dielectric layer between the first electrode and the second electrode.

As described herein a switching resistor has a low resistance state and a high resistance state. The switching resistor comprises a dielectric layer disposed between a lower electrode and an upper electrode. A boundary surface structure is formed on a boundary surface between the dielectric layer and a first one of the lower or upper electrodes. The boundary surface structure comprises a pillar of the first one of the electrodes extending into a corresponding hole formed in the dielectric layer. The pillar and hole extend in a direction perpendicular to the dielectric layer, towards the second, other, one of the lower or upper electrodes. The boundary surface structure acts to promote the formation of a conductive pathway in the dielectric layer between boundary surface structure and the second one of the electrodes.

BRIEF DESCRIPTION OF THE DRAWINGS

Various implementations of the invention will now be described, by way of example only, with reference to the accompanying drawings, in which.

DETAILED DESCRIPTION

Please note that aspects and features of apparatus and methods discussed herein which are not described in detail may be implemented in accordance with any conventional technique for implementing such aspects and features.

Figure 1:
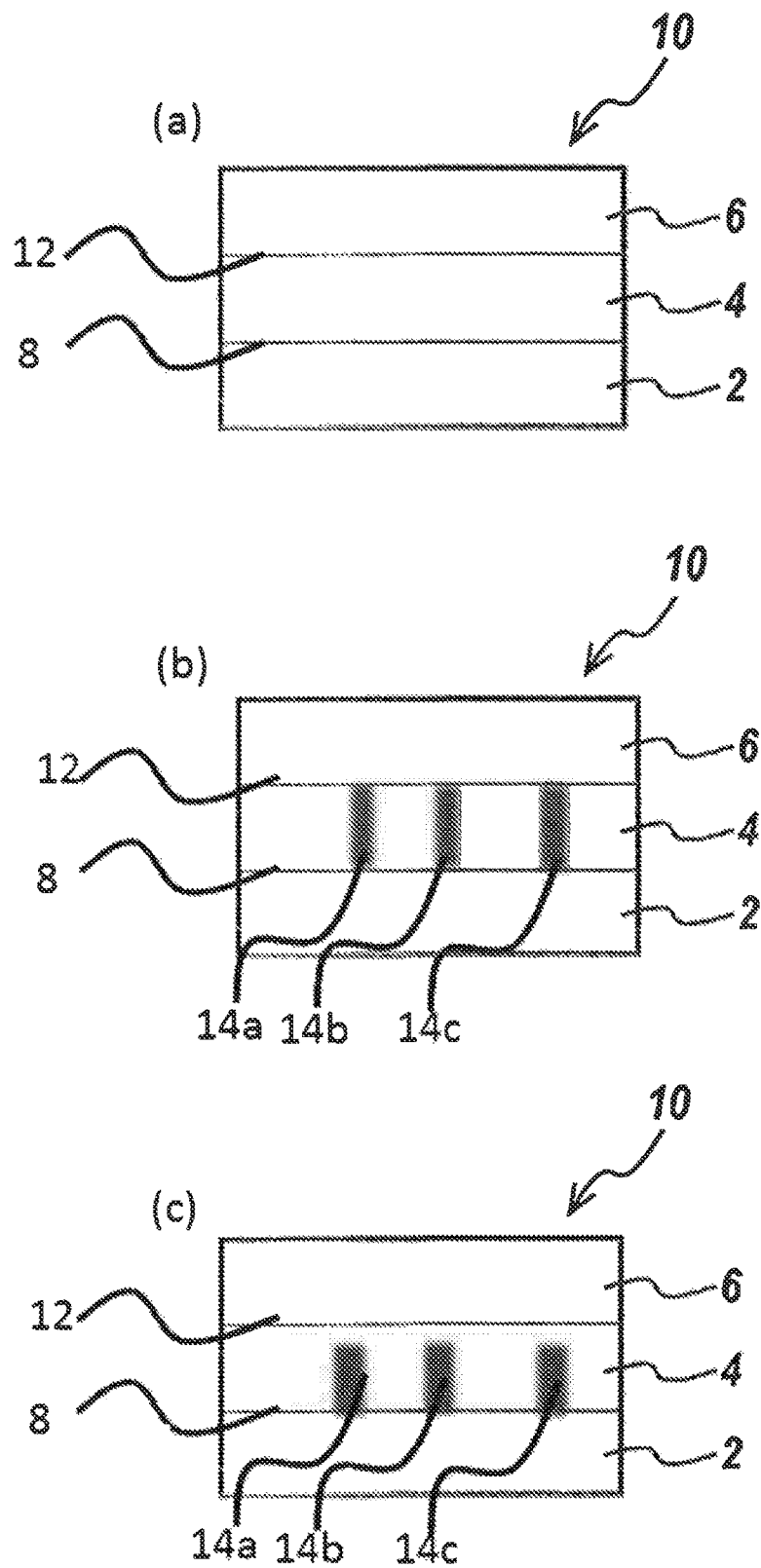
FIG. 1(a) shows a cross-sectional diagram of a switching resistor as described herein in a pristine state.
FIG. 1(b) shows a cross-sectional diagram of the switching resistor in a low resistance state.
FIG. 1(c) shows a cross-sectional diagram of the switching resistor in a high resistance state.

FIG. 1(a) shows a cross-section of an example switching resistor 10 in the pristine state. The switching resistor 10 comprises a first electrode 2, a dielectric layer 4 and a second electrode 6. There is a first boundary surface 8 between the first electrode 2 and the dielectric layer 4, and a second boundary surface 12 between the second electrode 6 and the dielectric layer 4. In a typical manufacturing process, the first electrode 2 acts as a base, and the dielectric layer 4 is formed on the first electrode 2 by any suitable technique, e.g. sputtering. The second electrode 6 is then formed on the dielectric layer 4. Accordingly, the first electrode 2 may be referred to herein as the lower or bottom electrode, and the second electrode 6 may be referred to herein as the upper or top electrode. As described in more detail below, the first boundary layer 8 between the first electrode 2 and the dielectric layer 4, and/or the second boundary layer 12 between the dielectric layer 4 and the second electrode 6, may be textured. In the pristine state, the resistance between the first and second electrodes is very high.

In some devices, the first electrode 2 and the second electrode 6 are formed from the same material—these are referred to as unipolar devices. In other devices, the first electrode 2 and the second electrode 6 are formed from different materials—these are referred to as bipolar devices.

FIG. 1(b) shows a cross-section of the example switching resistor 10 after it has been switched to the low resistance states (LRS), also known as the on state. This switching can be achieved by providing electrical connections to the first and second electrodes and by applying an appropriate voltage bias between the two electrodes. The switching resistor transitions from the pristine state to the LRS, a process known as electroforming. The low resistance of the LRS is believed to occur due to the formation of one or more conductive filaments 14a, 14b, 14c in the dielectric layer 4 which extend between the first electrode 2 and the second electrode 6. (Although FIG. 1(b) illustrates three conductive filaments, it is believed that in some implementations at least, only a single conductive filament may form within the switching resistor 10).

FIG. 1(c) shows a cross-section of the switching resistor 10 after it has now transitioned to high resistance state (HRS), also known as the off state. Such a transition may be achieved by supplying a high level of current through the device. The HRS has a value of resistance intermediate that of the pristine state and the LRS. It is believed that in the HRS, the one or more conductive filaments from the LRS no longer extend fully from the first electrode 2 to the second electrode 6. For example, FIG. 1(c) shows schematically that the conductive filaments 14a, 14b, 14c no longer reach the upper or second electrode 6 (however, the location of the interruption for any given filament may vary according to the particular circumstances). (Note that the pristine state of FIG. 1(a) is not recovered after the device has been transitioned into a LRS).

Switching between LRS and HRS states is well defined with a resistance contrast of typically 100 or more. The process of applying a voltage between the first electrode 2 and the second electrode 6 to switch the switching resistor from the HRS to the LRS is referred to as the 'set' process (i.e. to transition from off to on). Conversely, the process of applying a voltage between the first electrode 2 and the second electrode 6 to switch the switching resistor from the LRS to the HRS is referred to as the 'reset' process (i.e. to transition from on to off).

In unipolar devices, the reset process generally requires a higher (greater magnitude) voltage to be applied to the device 10 than for the set process. It is believed that the reset process for such devices may be caused by Joule heating resulting from a high current, which disrupts the filament, and so prevents conduction from the first electrode to the second electrode. Such disruption may be localised to a particular position along the filament, for example, at the top of the filament, such as shown in FIG. 1(c). For bipolar devices, the reset process generally requires applying a voltage of opposite polarity to that applied for the set process.

Figure 2:
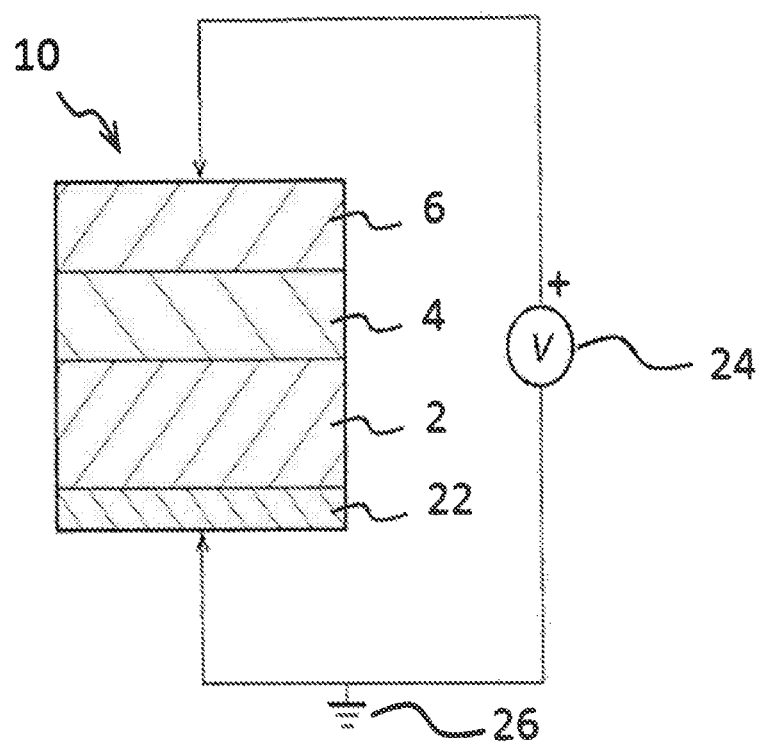
FIG. 2 shows a cross-sectional diagram of the switching resistor including external components for the voltage biasing of the switching resistor.

FIG. 2 shows a cross-section of the switching resistor 10 together with components for applying a voltage (bias) to the switching resistor. In particular, the switching resistor 10 is supported on a substrate 22 (also referred to as a wafer), which is most typically a semiconductor (such as Si) or a dielectric (such as $SiO_2$, sapphire or quartz). The first electrode layer 2, the dielectric layer 4 and the second electrode layer 6 are deposited onto the substrate in the above order. Note that in some cases, the substrate 22 or wafer itself acts as the first electrode (in which case the substrate 22 must be formed of a suitable conductive material, such as a doped semiconductor or metal).

FIG. 2 further includes a battery or cell 24 to apply a bias voltage to the switching resistor 10 by electrically connecting the positive terminal of the voltage source 24 to the second electrode layer 6 and the negative terminal (i.e. earth 26) to the contact layer 22 (or directly to the first electrode 2). Typically the voltage source can be controlled to provide a suitable voltage and current to the device 10 to perform the desired setting and resetting operations. Note that bias voltages are defined herein with respect to the relatively polarity of the second (top) electrode 6 with respect to the first (lower) electrode 2. Thus the configuration shown in FIG. 2 represents a positive applied voltage (since electrode 6 is positive with respect to electrode 2). However, if the connections of voltage source 24 were applied in the reverse configuration, this would represent a negative applied voltage (i.e. a negative bias). For the configuration of FIG. 2, the polarity the bias also reflects the polarity of the second electrode 6 relative to ground 26 (for the ground connection shown in FIG. 2).

The dielectric layer (4) may comprise any dielectric material suitable for use in a memory resistor, such as silicon oxide ($SiO_x$, where x does not equal 2 (non-stoichiometric silicon oxide)), silicon dioxide ($SiO_2$), silicon nitride, silicon carbide, silicon oxynitride, aluminium dioxide (alumina), germanium oxide, germanium nitride, gallium nitride, zinc oxide, titanium oxide, tantalum oxide, niobium oxide, and high-K dielectrics such as hafnium dioxide, hafnium silicate, zirconium dioxide, and zirconium silicate. The dielectric material may be stoichiometric or non-stoichiometric. Most commonly, the dielectric is silicon oxide, silicon nitride, silicon carbide or silicon oxynitride, with silicon dioxide particularly favoured. The use of silicon-based compounds as the dielectric layer allows the manufacture of device 10 to be integrated more readily into CMOS processing.

The dielectric layer 4 typically has a thickness of from about 3 nm to about 1 μm, more commonly in the range about 3 nm to about 200 nm, more commonly in the range of about 15 nm to about 170 nm, more commonly in the range of about 20 nm to about 50 nm. The dielectric layer 4 may adopt any suitable structure for forming a conductive filament when the memory resistor is in the LRS. Without being bound by a particular theory, it is believed that the dielectric layer 4 of device 10 is inhomogeneous, whereby the dielectric material does not have a uniform structure but has at least two domains. The domains may have different degrees of defects or deficiency centres. The boundaries between domains may act as efficient nucleation centres for the formation of conductive pathways or filaments between the first and the second electrodes.

The dielectric layer (4) may be deposited by any technique that allows a suitable structure to be formed, for example, sputtering, chemical vapour deposition (CVD), molecular beam epitaxy (MBE), metal-organic chemical vapour deposition (MOCVD), atomic layer deposition (ALD), spin-coating and evaporation techniques may be used. Note that sputtering typically results in columnar growth of the dielectric layer and so layers produced in this way are not homogeneous, i.e. formation of sputtering may help to form the desired inhomogeneities. One such potential technique is magnetron sputtering, in which atoms are ejected from a solid target material as a result of bombardment of the target by highly energetic particles. The ejected atoms can be then deposited onto a substrate, enabling the growth of a thin film. Such magnetron sputtering may involve magnetron co-sputtering, in which more than one atom type is used to form a thin film on a substrate. Alternatively, if techniques are used for forming the device 10 that would ordinarily produce highly homogeneous materials, such as CVD, MBE, MOCVD and ALD, steps may be taken to reduce the level of homogeneity.

In fabrication of the switching resistor 10, the first electrode 2 may be formed on a suitable substrate 22 and the second electrode 6 may be formed on the dielectric layer 4 using conventional deposition technology, such as sputter deposition, evaporation, vapour deposition and lithographic processes. The first and second electrodes are typically about 10 nm to about 1 μm thick, for example, about 50 nm to about 500 nm thick.

The materials of the first and second electrodes (2,6) may be independently selected from any conventional electrode material(s), such as silicon (polycrystalline or crystalline), indium tin oxide (ITO), graphene, zinc oxide, tin oxide, and metals such as gold, silver, copper, titanium, molybdenum, aluminium and chromium. In some implementations, the first and second electrodes 2,6 are metallic electrodes (which may have different metal work functions). Another possibility is that at least one of the first and second electrodes 2, 6 is silicon, for example, the first electrode 2 and the second electrode 6 may both be silicon. The first and second electrodes 2,6 may have p-type doping or n-type doping.

Figure 3:
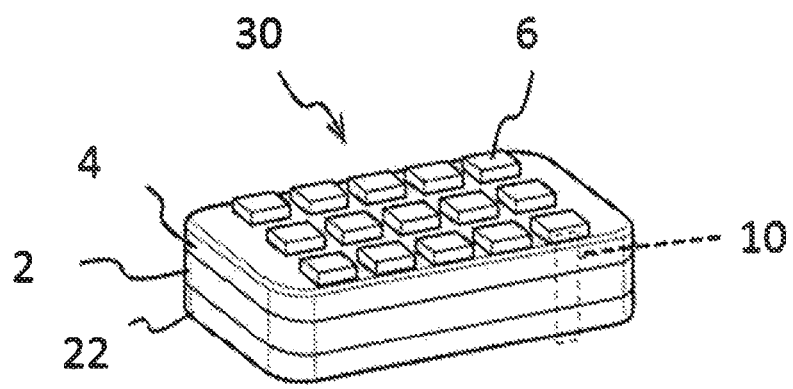
FIG. 3 shows an array of switching resistors.

FIG. 3 shows an example array 30 of multiple switching resistors 30. The shape and size of the electrodes 2, 6 may be modified to form appropriate electrical contacts using techniques such as photolithography and plasma etching. Typical contact sizes are from about 50 $nm^2$ to about 6 $mm^2$, most commonly from about 50 $nm^2$ to about 200 $nm^2$. In particular, the size of the upper electrode 6 may be modified in this way in order to define the size of an individual switching resistor device.

For a switching resistor 10 as described herein, it has been found that the texturing (roughness) of the dielectric-electrode interface (boundary surface) is an important parameter for controlling switching efficiency. Devices with a textured boundary surface exhibit lower switching voltages and currents, tighter distributions of switching voltages, and far more switching cycles (set/re-set operations) than switching resistors without such texturing. (It will be appreciated that the utilisation of lower voltage and current levels for switching saves operating power).

Control of surface roughness at the dielectric-electrode interface helps device optimisation. Such control may be implemented by at least the following two approaches:
 1. Selecting a deposition technique and process parameters that produce an inherently rough interface. For example, sputtering thick electrode films at appropriate powers, flow rates and pressures, results in considerable interface roughness (texture) on the scale of several nanometres.
 2. Patterning of the electrode surface prior to deposition of the oxide (or other dielectric). A similar effect may potentially be achieved by patterning the substrate surface prior to deposition of the lower electrode, and/or the dielectric surface may be patterned prior to the deposition of the top electrode.

As example implementations, metal-oxide-metal switching resistors (ReRAM devices) were fabricated on silicon substrates with a top layer of 4 µm of thermal oxide ($SiO_2$) by sputtering. A bottom electrode 2 comprising 160 nm of Mo (molybdenum) was then deposited onto the $SiO_2$ layer by sputtering. The switching oxide (dielectric layer 4) was then deposited onto the bottom electrode by reactive magnetron sputtering (Kurt Lesker PVD75) (see http://www.lesker.com/), in which an undoped silicon target was used to sputter the $SiO_x$ thin film onto the substrate in an oxygen-rich environment. The sputtering conditions were: RF power 110 W, the $Ar:O_2$ ratio was 1:1 and the Capman pressure was 3 mT. In total, a thickness of 35 nm of $SiO_x$ was deposited as the dielectric layer 4 onto the Mo layer (bottom electrode 2). After this deposition of the dielectric layer, a thin (3 nm) adhesion layer of Ti was deposited, followed by deposition of a 100 nm layer of Au by electron beam evaporation to serve as the top electrode 6 for each device. A shadow mask was used to define the top electrode area for each device, with the size of an individual top electrode 6 varying from 200 µm×200 µm to 800 µm×800 µm.

Figure 4:
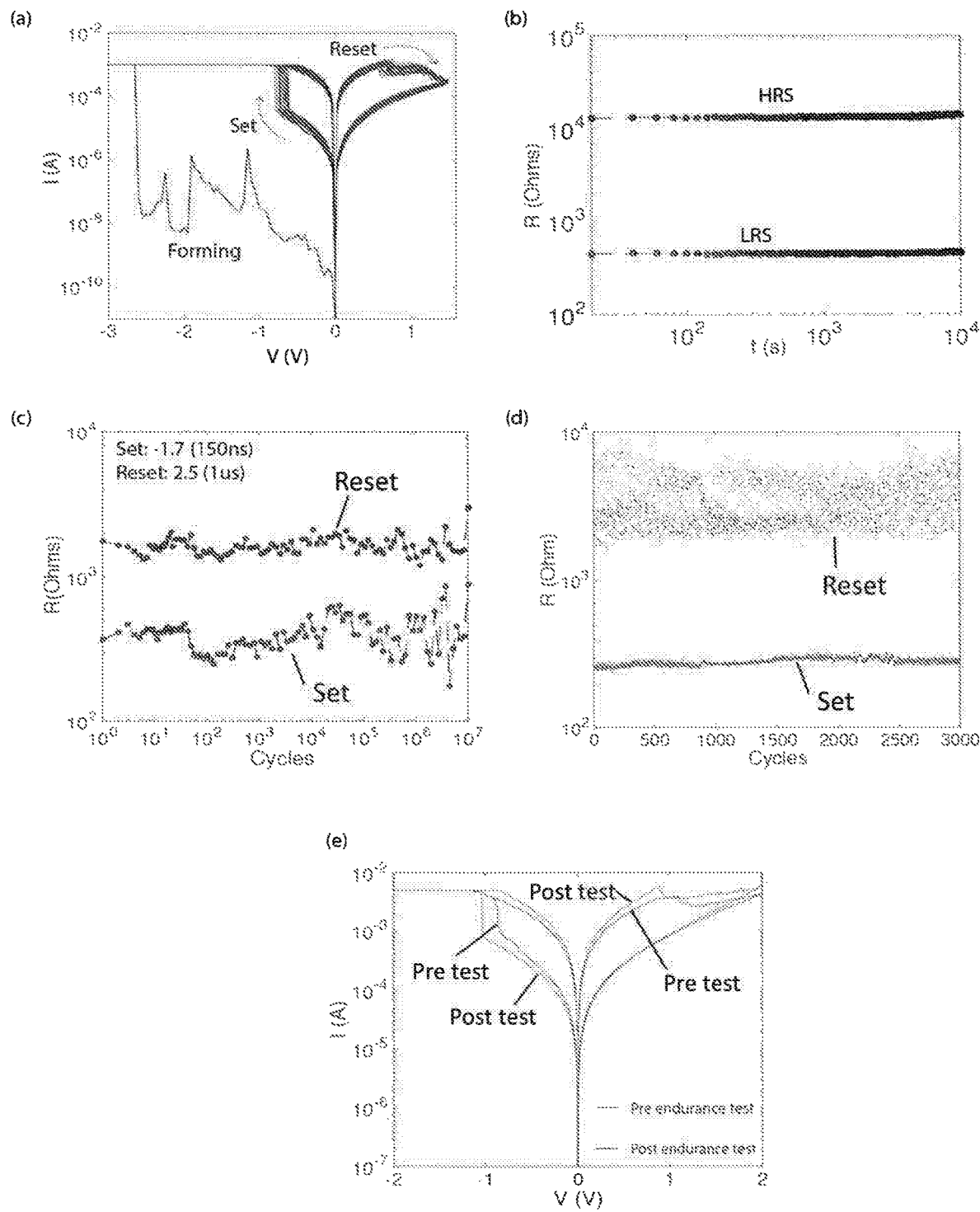
FIG. 4(a) shows a graph detailing voltage bias sweeping of a $SiO_x$ switching resistor as described herein.
FIG. 4(b) shows a graph detailing a resistive state retention test of an $SiO_x$ switching resistor as described herein.
FIG. 4(c) shows a graph detailing an endurance test after $10^7$ cycles of aa $SiO_x$ switching resistor as described herein.
FIG. 4(d) shows a graph detailing an endurance test after $3 \times 10^3$ cycles of an $SiO_x$ switching resistor as described herein.
FIG. 4(e) shows a graph comparing a voltage bias sweep pre- and post-endurance test of a $SiO_x$ switching resistor as described herein.

FIG. 4 shows the switching performance obtained from a switching resistor ($SiO_x$ ReRAM device) fabricated according to the method described above, and having an electrode size 400 µm×400 µm. The electrical characterization was performed using a Keithley 4200 semiconductor characterization system (the voltage sweeps were obtained using source measuring units, and the endurance testing using a pulse measuring unit). Firstly, the oxide was electroformed (i.e. to transition from the pristine to the LRS) by sweeping the voltage with 1 mA of current compliance. The switching resistor was then cyclically reset (transitioned from the LRS to the HRS) and set (transitioned from the HRS to the LRS). Electroforming of the switching resistor occurs at around −2.6V and, significantly, it electroforms only in the negative sweep—i.e. with a negative potential bias applied. This excludes the field-induced migration of Ti cations from the top electrode causing the change in resistance (which would represent an extrinsic mechanism). After electroforming, the device shows bipolar switching with low switching voltages; from −0.9V to −1.1V to set and from 0.85V to 1.3V to reset (as shown in FIG. 4($a$)). Note that these switching values are lower than those previously reported for intrinsic $SiO_x$ ReRAM devices—such as 5V; 1.2V; and −1.5V [14]; −5V; −3V; and 3.5V [11] and 20V; 3V; and 8V [12,13] for the electroforming; set and reset voltages, respectively.

FIG. 4($b$) shows the retention test of a switching resistor for $10^4$s. An ArC One characterisation board was used to conduct the retention measurements. No degradation of either LRS or HRS is observed. FIG. 4($c$) shows the endurance test—$10^7$ cycles with 10 sampled data points per cycling decade (factor of 10 in number of cycles). FIG. 4($d$) shows 3000 cycles recording every cycle. FIG. 4($e$) confirms the functionality of the device after $10^7$ cycles and the slight increase of the reset current (compare with FIG. 4($a$)).

For the endurance test (FIG. 4($c$)), the following pulses were used: −1.7V 150 ns to set, 2.5V 1 µs to reset and 0.1V 200 ns to read. Small fluctuations of resistance states at the end of the endurance test are the result of the slight increase of the reset current and the internal current limit of 10 mA for the Keithley PMU. The I-V curves shown in FIG. 4($e$) confirm the functionality of the device after $10^7$ cycles and the slight increase of the reset current. The endurance of $10^7$ cycles without device failure is possibly the highest endurance reported for intrinsic $SiO_x$ ReRAM devices.

Figure 5:
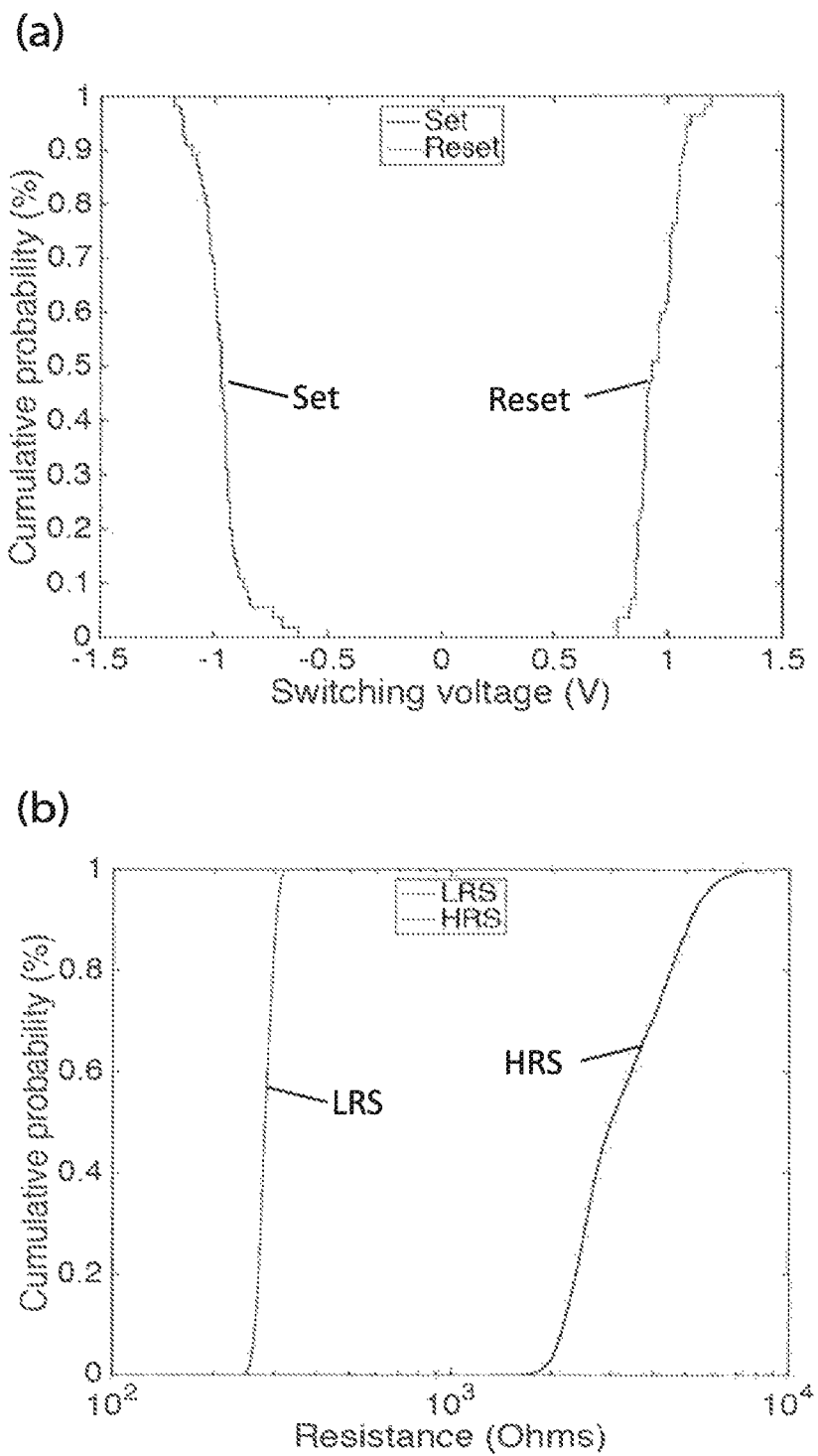
FIG. 5(a) shows the cumulative distributions of the set and reset voltages for a switching resistor as described herein.
FIG. 5(b) shows the cumulative distributions of the resistance values of the high resistance state and the low resistance state of a switching resistor as described herein.

An important parameter for switching resistors such as described herein is the uniformity of the switching voltages and the uniformity of the resistance states. These are analysed in the cumulative probability plots in FIGS. 5($a$) and 5($b$), which respectively show the cumulative distributions for the set and reset voltages (FIG. 5($a$)) and the low resistive states (LRS) and high resistive states (HRS) (FIG. 5($b$)). The device being tested (again formed as described above) shows a tight distribution of the switching voltages (calculated from the 110 I/V sweeps). More specifically, there is a spread of 0.27V for the set voltage and a spread of 0.21V for the reset voltages, calculated from 10% to 90% cumulative probabilities. The LRS shows the tighter distribution of the two resistance states: 13.7% from the median, compared to HRS, 85.4% from the median (again calculated from 10% to 90% cumulative probabilities).

Figure 6:
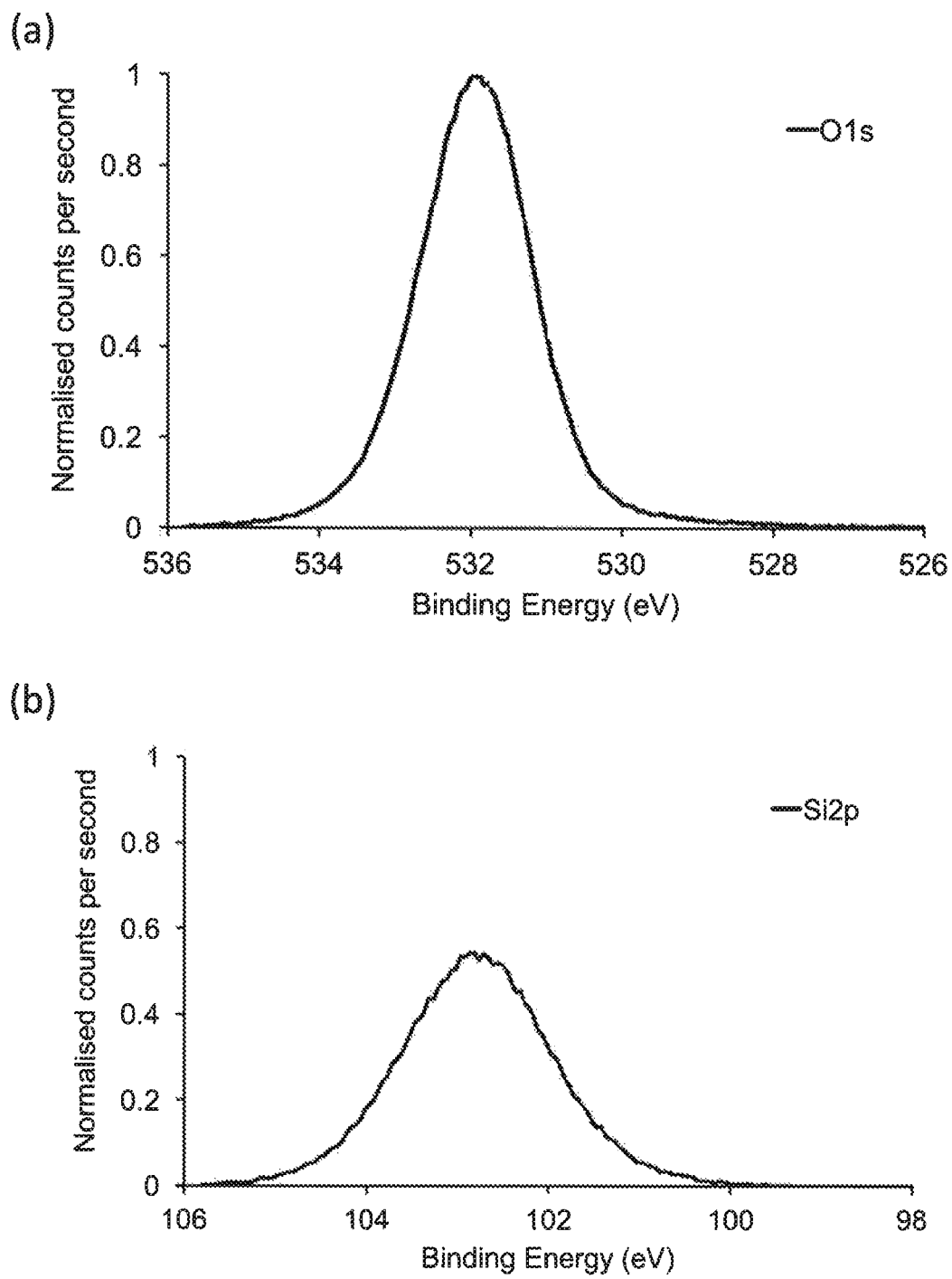
FIGS. 6(a) and 6(b) show X-ray photoelectron spectroscopy measurements of the O-1s and Si-2p peaks of an $SiO_2$ switching resistor as described herein.

FIG. 6 shows normalised oxygen O 1s and silicon Si 2p X-ray photo-electron spectra (XPS) (normalised to the O 1s signal) of the dielectric (oxide) layer 4. The XPS measurements were performed using a Thermo-Scientific K-Alpha system with a monochromatic Al source at $10^{-8}$ Torr. The estimated stoichiometry of the $SiO_x$ oxide film is around x=1.6. The position of the Si 2p peak, around 102.8 eV, corresponds to the $Si^{3+}$ oxidation state of silicon. It has been suggested that this configuration introduces intrinsic interfaces into the amorphous $SiO_x$ matrix, making it rich in dangling bond defects [15].

To understand further the good switching properties presented above, more specifically the low electroforming/switching voltages and the enhanced endurance—we used a scanning transmission electron microscope (scanning TEM or STEM) to study the microstructure of the oxide layers. The scanning TEM (STEM) visualises the microstructure of the oxide layer of the switching resistor. An FEI Helios focused ion beam (FIB) was used to prepare TEM cross-sections, and STEM imaging was carried out at 80 keV using an FEI Titan M/STEM.

Figure 7:
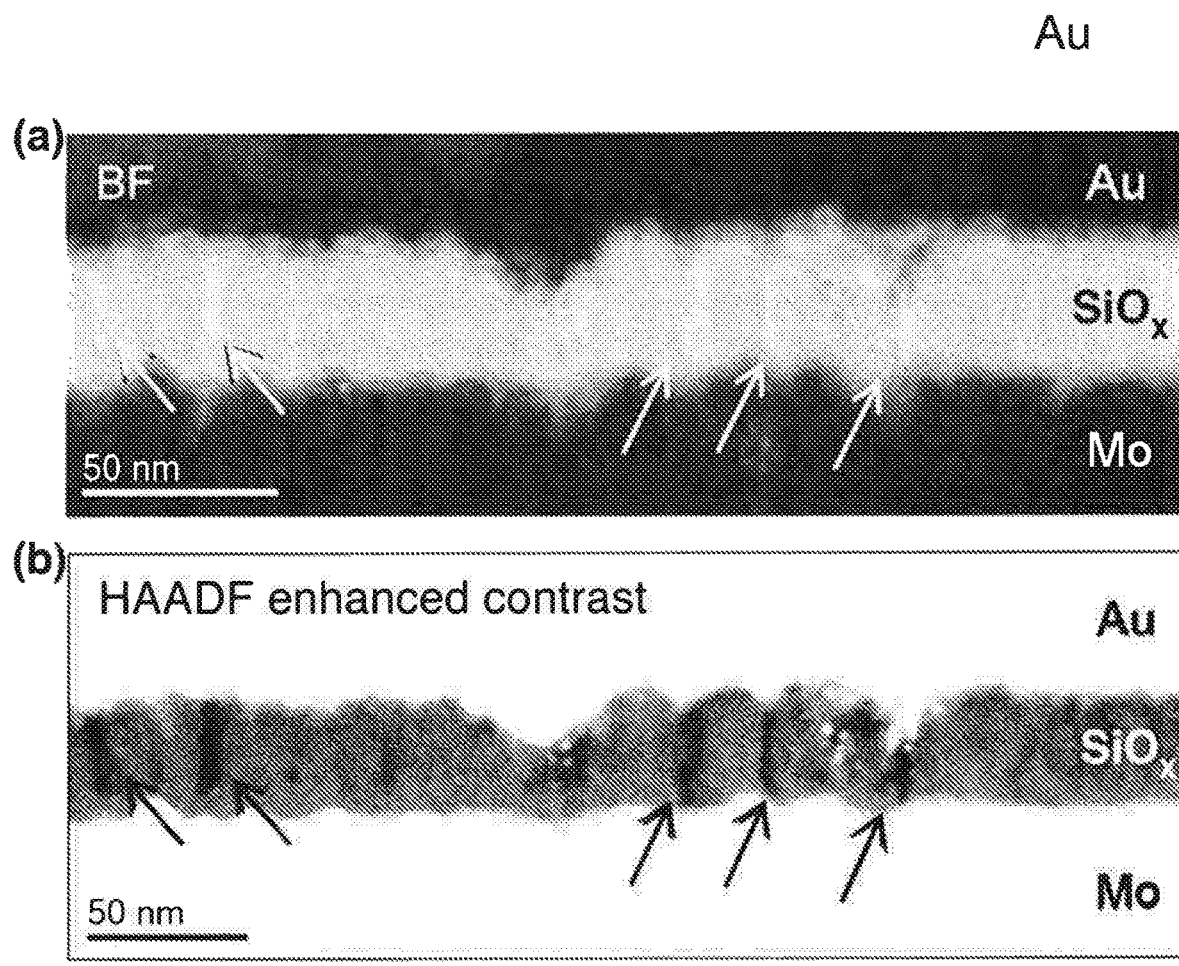
FIG. 7(a) shows a cross-sectional bright field STEM image of a switching resistor as described herein.
FIG. 7(b) shows an intensity-clipped High Angle Annular Dark Field (HAADF) image of the same switching resistor as shown in FIG. 7(a).

FIG. 7$a$ shows a cross-sectional bright field STEM image of the switching resistor of the device. Clearly there is observable a first (lower) textured boundary surface between the Mo electrode and the $SiO_x$ layer, and a second (upper) textured boundary surface between the Au electrode and the $SiO_x$ layer. For both textured boundary surfaces, the variation (roughness) in the height of the surface is on the order of 5 nm. This level of variation in textured surfaces represents about 3% of the Mo electrode thickness, about 15% of the $SiO_x$ thickness, and about 5% of the Au electrode thickness.

It is believed that the texturing of the electrode surfaces may have a positive impact on switching properties. It has been found that sputtering materials at lower temperatures can enhance columnar growth [16]. Additionally, providing a rough or textured electrode surface is believed to promote atomic shadowing during oxide deposition; this can result in enhanced columnar growth, which in turn can have a significant (positive) influence on the switching properties. Such columnar growth is clearly observed (indicated by the red arrows) in FIG. 7($a$) in the form of bright vertical streaks. Additional streaks are visible across the oxide layer with a spacing of approximately 20 nm.

The streaks correspond to regions of low intensity in a High Angle Annular Dark Field (HAADF) image in FIG. 7($b$). Regions of low intensity in the HAADF image correspond to regions of low atomic number, and suggest the inter-columnar boundaries have a lower density than the surrounding regions of the dielectric material. The good switching properties—more specifically the low electroforming/switching voltages and the enhanced endurance—are believed to occur due to the presence of these columns in the dielectric layer 4, which are in turn created (or at least enhanced) by providing roughness or texturing at the boundary surface or interface between the bottom electrode 2 and the dielectric layer 4.

This above finding is consistent with a previous study in which the tops of the columns (columnar structures) were observed using scanning tunneling microscopy. This study showed enhanced conductivity around the edges of the columns [9, 18]. From the XPS results shown in FIGS. 6(*a*) and 6(*b*), the configuration of the silicon in the switching resistor suggests the presence of defect-rich intrinsic interfaces within the dielectric layer 4. It is believed that the edges of the columns therefore provide favourable sites for oxygen movement and filament formation due to their defect-rich nature. Consequently, enhanced columnar growth will promote easier electroforming as well as lower switching voltages.

Figure 8:
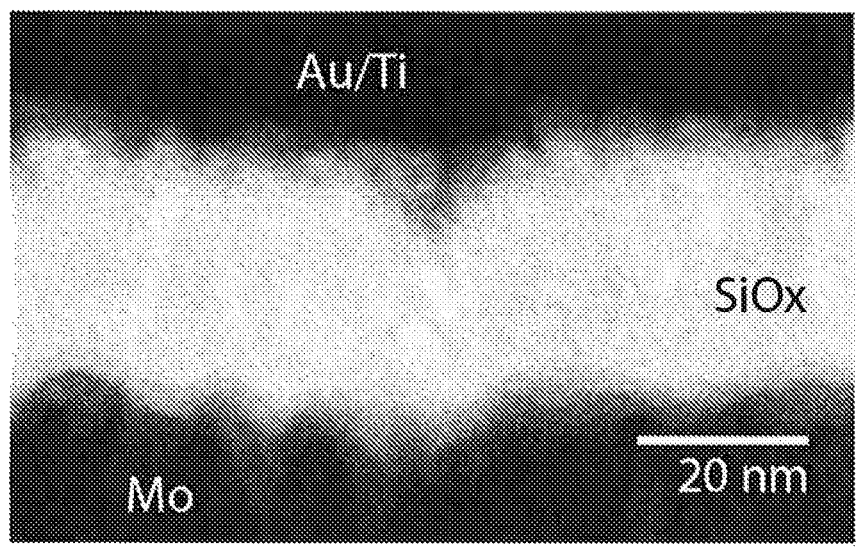
FIGS. 8(a) and 8(b) show a bright field STEM and an EELS elemental map of a switching resistor as described herein.
Figure 8:
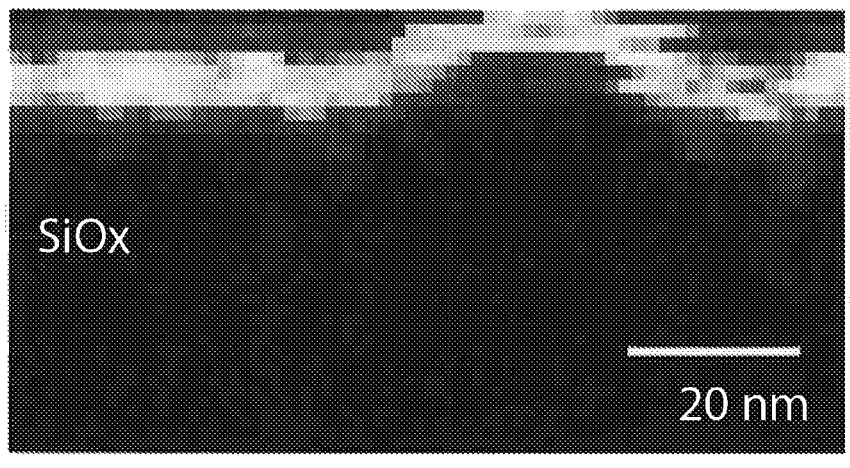
Figure 8:
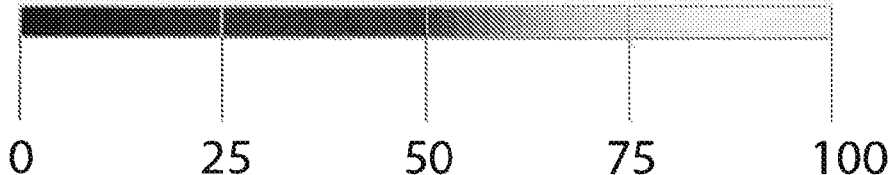

Another important effect of the interface roughness or texturing is the enhancement of the local electric field. This can lead to increased electron injection and hence increased rate of creation of Frenkel pairs, consisting of oxygen vacancies and oxygen interstitial ions, with oxygen interstitial ions characterised by low migration barriers of around 0.2 eV [19, 20]. However, we see no evidence of significant Ti diffusion into $SiO_x$ layer, as shown in the bright field STEM image in FIG. 8(*a*) and the EELS Ti elemental map in FIG. 8(*b*). (The EELS analysis of FIG. 8(*b*) was performed using a Gatan Imaging Filter (GIF) and a collection semi-angle of 30 mrad).

The above implementation of a switching resistor provides an example a switching resistor as described herein. This example comprises an intrinsic $SiO_x$ ReRAM device. The results presented herein, based upon an electrical characterisation of the device and an analysis of the microstructure of the oxide layer, suggest that improved switching properties are a consequence of a rough oxide-metal surface between the dielectric layer 4 and the first electrode 2. It is believed that there are two factors which may lie behind these improved switching properties (and may act simultaneously). Firstly, a rough or textured oxide-electrode surface causes atomic shadowing during deposition of the dielectric layer that promotes columnar growth within the dielectric layer. The edges of the columns provide defect-rich sites where vacancy formation and oxygen ion mobility can be enhanced. Secondly, as electron injection is believed to be the mechanism for the generation of Frenkel defects, the enhancement of the local electric field due to the rough interface may lead to more electrons being injected. This understanding provides a route to potential further optimisation of such device (especially silicon oxide based ReRAM devices).

The approach described herein therefore provides a switching resistor having a low resistance state and a high resistance state. The switching resistor comprises a dielectric layer 4 disposed between a first electrode 2 and a second electrode 6, and a textured boundary surface 8 between the first electrode and the dielectric layer. The textured boundary surface acts to promote the formation of a conductive pathway in the dielectric layer between the first electrode and the second electrode (which in turn helps the device to operate as a switching resistor).

In some implementations, the textured boundary surface may comprise a predetermined texture pattern. Such a pattern may repeat regularly, and is designed in advance to try to enhance the formation of column structures (as described below). Typically such a predetermined texture pattern is provided to the boundary surface as part of a manufacturing step of the switching resistor which is specifically utilised to add the texture pattern to the device. This manufacturing step may be any appropriate additive or subtractive process, for example, the textured boundary surface is created by e-beam patterning. A fast e-beam method allows the patterning of nm-scale features on a large surface area (up to cm$^2$). The e-beam patterning may create a predetermined pattern of texturing, such as a grid arrangement of grooves with raised portions in between. In some cases, the predetermined texture pattern may be applied to a substrate that underlies the first electrode, and the first electrode then follows the patterned topography (texturing) of the substrate layer.

In other cases, the textured boundary surface may comprise random (rather than predetermined) texturing, for example, random texturing provided inherently as part of a manufacturing step of the switching resistor (such as low temperature sputtering of the first electrode, e.g. at temperatures below 250° C., more particularly below 120° C., more particularly below 60° C. (e.g. at room temperature). In this case, the general parameters of the texturing may be controlled, based on the physical properties of the formation method, but not the specific details of the resulting texture layout.

The first electrode and second electrodes may be formed of any suitable material, such as a metal or silicon. (The first and second electrodes may be formed of the same or different materials). The dielectric layer 4 is typically an oxide of silicon ($SiO_x$), however, any other suitable dielectric may be used. The devices disclosed herein are primarily bipolar devices (i.e. the first and second electrodes are made of different materials), however, a textured boundary surface between the first electrode and the dielectric layer may also be formed in a unipolar device.

In general terms, the dielectric layer is formed on the first electrode, after the textured boundary surface has already been created on the upper surface of first electrode (onto which the dielectric is deposited). It will be appreciated that creating a textured boundary surface runs contrary to conventional thinking in the CMOS community, which is focused on achieving flat interfaces and high quality defect-free oxides. However, it has been found that the resulting dielectric layer includes column structures extending from the textured boundary surface between the first electrode and the dielectric layer towards the second electrode, and the textured boundary surface enhances formation of the column structures in the dielectric layer. At least one of the column structures act to form the conductive pathway in response to the application of an electroforming voltage to the first and second electrodes of the switching resistor. In particular, the boundaries between the column structures have a lower density than the surrounding regions of the dielectric material, and this may encourage the formation of a conductive pathway (filament) at such boundaries.

For devices as described herein, electroforming of the switching resistor typically occurs at a voltage in the range −4 to −1 Volts, more particularly in the range −3 to −2 volts; setting of the switching resistor to the low resistance state typically occurs in the range −2 to −0.5 volts, more particularly in the range −1.1 to −0.9 volts; and re-setting of the switching resistor to the high resistance state typically occurs in the range 0.5 to 2 volts, more particularly in the range 0.85 to −1.3 volts. It will be appreciated that these applied voltages to cause state transitions (pristine to LRS, LRS to HRS, and HRS to LRS) are low (small in magnitude)

compared to many existing devices, which can help to support lower power requirements.

There are various ways to quantify the texturing or roughness at the boundary surface between the first (lower) electrode and the dielectric layer. In particular, such roughness represents variations in height of the surface (where height is measured in the direction perpendicular to the general plane of the boundary surface). There are a number of (statistical) parameters can be used (alone or in combination) to quantify the roughness. Examples of such parameters include:

*peak-to-peak variation—i.e. the difference in height between the lowest part of the surface and the highest part of the surface—(or some predetermined fraction of this peak-to-peak variation, such as 0.5);

*a statistical range, for example, the difference between an upper threshold (UT) and a lower threshold (LT), such that a given fraction of the surface lies above the UT, and a given fraction of the surface lie below the LT. For example, the given fraction may be defined as 5%, hence the resulting range represents the height spread of the middle 90% of the surface;

*a standard deviation of the surface height, or other similar measures, such as root-mean-square.

Note that the most suitable parameter for quantifying the texturing may depend on the nature of the texturing. For example, if the texturing is random, then this might be best represented as a standard deviation. In contrast, if the texturing involves a specific pattern, such as a set of grooves of constant depth cut into an otherwise flat surface, then this might be best represented as a peak-to-peak variation. In any event, the skilled person will be aware of many different approaches for quantifying the surface roughness.

Note that whichever parameter (or parameters) are chosen for defining the surface roughness (height variation), these may be expressed in absolute terms, or else in relative terms. In particular, for the latter case, the height variation may be expressed as a fraction of the average (e.g. mean) thickness of the first electrode or as a fraction of the average (e.g. mean) thickness of the dielectric layer.

In some of the devices described herein, the surface roughness is typically on a scale in the range 1-20 nm, more particularly in the range 2-10 nm, more particularly in the range 3-7 nm. Alternatively (or additionally), the scale of the surface texturing, in a direction normal to the surface, may lie in the range of 0.1-15% of the thickness of the first electrode, more particularly in the range 1-5%. Alternatively (or additionally), the scale of the surface texturing, in a direction normal to the surface, may lie in the range of 5-30% of the thickness of the dielectric layer, more particularly in the range 10-20%.

Also of relevance is the horizontal scale of such height variation. Thus for a specified height variation, the horizontal scale indicates the horizontal distance over which such height variation occurs. For example, for a regular grid pattern of grooves of constant depth cut into an otherwise flat surface, the horizontal scale might reflect the separation of adjacent grooves. Alternatively, for a random pattern, the horizontal scale might indicate a sample area at which the measured height variation would be expected to match the overall standard deviation.

In some of the devices described herein, the surface texturing occurs within a width (or horizontal scale), measured parallel to the boundary surface between the first electrode and the dielectric layer, of typically less than 60 nm, more particularly less than 40 nm, and more particularly within a width in the range 10 to 30 nm.

The approach described herein helps to provide excellent intrinsic bulk switching properties for switching resistors (resistant switches), such as $SiO_x$ RRAM devices. Particular example devices have been produced which exhibit low electroforming voltages (as low as −2.6V), low switching voltages (+/−1V), high uniformity in switching voltages and resistance states, high endurance (>$10^7$ cycles), and good retention (>$10^4$s). The texturing of the electrode-switching layer surface, as described herein, is believed to affect the microstructure of the oxide (dielectric) and thereby enhance columnar growth within the dielectric, which in turn leads to the favourable switching properties.

In addition, the intrinsic switching effect is caused by the formation of conductive filaments in the switching (dielectric) layer, forming pathways between the opposing electrodes. An important consideration in filamentary RRAM is the location of the filaments. Unstable switching is thought to occur because of forming different filament configurations from cycle to cycle, which in turn results from of the ease of movement of oxygen laterally around conductive filaments. It is believed that the column structure created by the texturing helps to confine the filament position by will reducing this mobility of oxygen, and so leads to more stable switching.

Figure 9:
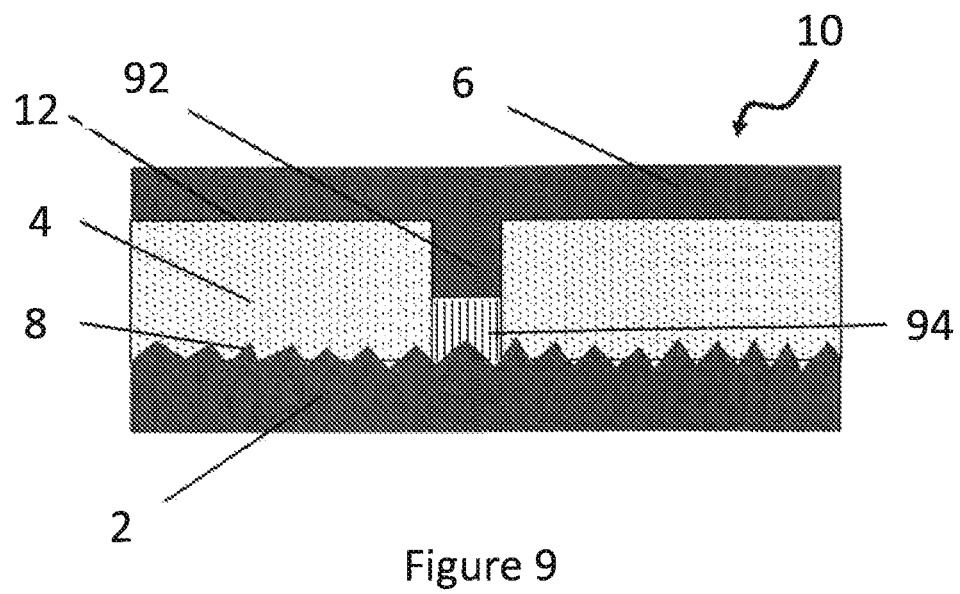
FIG. 9 shows a further cross sectional diagram of a switching resistor as described herein.

FIG. 9 shows a diagram of a switching resistor 10 with a first textured boundary surface 8 between the first electrode 2 and the dielectric layer 4, and a second boundary surface 12 between the dielectric layer 4 and the second electrode 6. The first textured boundary surface is shown schematically as comprising a series of triangular valleys and peaks. In comparison, the second boundary surface is substantially untextured (i.e. smooth), with the exception of a boundary surface structure 92.

Figure 10:
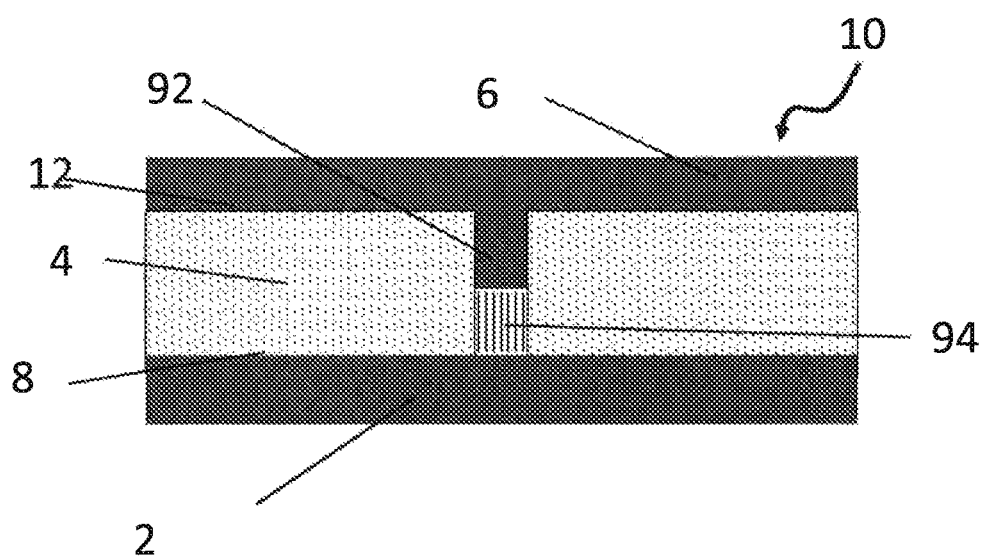
FIG. 10 shows a further cross sectional diagram of a switching resistor as described herein.

FIG. 10 shows a diagram of another example of a switching resistor 10. The switching resistor of FIG. 10 is substantially the same as that of FIG. 9, and also includes a boundary surface structure 92; however, the device of FIG. 10 does not have a first textured boundary surface 8 between the first electrode 2 and the dielectric layer 4 (rather the first boundary surface 8 is smooth).

This boundary surface structure 92 (for both FIGS. 9 and 10) represents a protrusion (pillar) of the second electrode 6 into the dielectric layer 4, or can be described alternatively as a hole or via in the dielectric layer 4. The boundary surface structure 92 has a width of the order of nm to tens of nm. Additionally, the boundary surface structure extends approximately 50% of the way through the thickness (depth) of the dielectric layer 4.

An individual switching resistor may contain one or more of boundary surface structures 92 (such as shown in FIGS. 9 and 10). For example, an array 30 (see FIG. 3) may be created so that each individual switching resistor 10 comprises one boundary surface structure 92, typically located centrally to the individual switching resistor 10 (i.e. in the middle, when viewed from above).

Any suitable method can be used to create the boundary surface structure 92. In some implementations, a fast e-beam method is used which allows the patterning of nm-scale holes in the dielectric layer over a large surface area (up to $cm^2$). These holes are then filled when depositing the second electrode 6 on top of the dielectric layer 4. Note that the (conductive) material used to fill the boundary surface structures 92 will typically be the same as the material of the second electrode 6, e.g. the boundary surface structures 92 and the second electrode may be integrally formed together. However, the boundary surface structures 92 may first be filled with one material, and then the second electrode 6 comprising another material may then be deposited over the dielectric layer 4 (and filled boundary surface structures 92).

In addition, while FIGS. 9 and 10 show the boundary surface structures 92 as extending down from the second electrode 6 into the dielectric layer 4, the boundary surface structures 92 may be formed instead as towers or pillars extending upwards from the first electrode 2 into the dielectric layer 4 (rather than as towers or pillars extending downwards from the second electrode). In this case the towers may be created integrally with the first electrode (e.g. by removing portions of first electrode material between the towers), or by separately depositing such towers onto the already formed first electrode 2. Typically, the boundary surface structure 92, such as a pillar or tower, is formed perpendicular to the boundary surface between the dielectric layer and the second electrode—e.g. the boundary surface structure 92 has sides (side walls) which are perpendicular to the boundary surface, and then an end wall which is parallel to the boundary surface.

Forming the boundary surface structure integrally with an electrode can help to reduce the number of processing steps in the formation of the device. Forming the boundary surface structure depending down from the upper (second) electrode supports the use of both a pillar (or other such structure) in conjunction with a textured lower electrode (such as shown in FIG. 9).

It has been found that in operating the switching resistor 10, a switching region 94 (as shown in FIGS. 9 and 10) forms beneath the boundary surface structure 92, in other words, between the boundary surface structure 92 and the first electrode 2 (or between the boundary surface structure 92 and the second electrode 2, if the former are formed as towers on the first electrode). In particular, a boundary surface structure 92 promotes the formation of conductive filaments in the switching region 94 in response to a suitable applied voltage. The conductive filaments extend through the dielectric layer 4 from the boundary surface feature 92 to the opposing electrode (the first electrode 2 in the case of FIGS. 9 and 10).

In operation of the switching resistors 10 of FIGS. 9 and 10, it is believed that the position of the conductive filaments is confined to the switching region 94, which is defined by the location of the boundary surface structure. As noted above, unstable switching is thought to be a result of different filament configurations from cycle to cycle, which are themselves a result of the ease of movement of oxygen laterally around conductive filaments. Confining the position of the conductive filaments in this manner can therefore help to reduce the mobility of the conductive filaments, and so lead to more stable switching.

The switching resistors described herein rely upon intrinsic switching, rather than extrinsic switching, which is used, for example, in conductive bridge memory (CBRAM) cells. In this latter type of cell, a conductive filament formed during the switching process is a metallic filament that is generated by the movement of metal ions within the insulating matrix under the application of an external field. The metal ions are derived from an oxidising electrode—i.e. they migrate from the electrode into the dielectric layer. In some such cells, a structured interface is used to provide points of high field to concentrate the electric field lines and hence provide a preferred site for the growth of a filament. In some cases, the structured interface includes a sharp apex to generate high local fields by concentrating the electric field lines at a point where the switching layer is at its thinnest between the apex and the counter electrode, which in turn may control and assist the metal ions in forming a conductive filament.

In contrast, the intrinsic switching of the devices described herein may form conductive filaments (for example) from oxygen vacancies in a silicon dioxide dielectric layer—without any diffusion of metal ions into the oxide. In this approach, there is no need for an oxidising electrode, rather both electrodes can be inert, and the textured boundary surface can be applied to either or both electrodes, i.e. the cathode and/or the anode (whereas it is more difficult to provide a textured boundary surface in a controlled manner for an oxidising electrode).

Furthermore, for intrinsic switching, the textured surface (or pillar such as shown in FIGS. 9 and 10) is not used to modify the electric field within the dielectric (oxide). Rather, the texture surface (and/or pillar) helps to template the formation of columnar growth in the dielectric (without seeking to modify the electric field within the oxide) by promoting an inhomogeneous microstructure of the oxide in such a way as to enhance switching characteristics. In particular, conductive filaments are believed to form preferentially at column interfaces not because of any field effects (or narrowing of the oxide layer), but because the column boundaries (edges) provide a high concentration of defects in a bridging structure, and these defects are precursors to the formation of filaments of oxygen vacancies within (internal to) the dielectric layer. In conclusion, the skilled person will be aware of various modifications that can be made to the above examples to reflect the particular circumstances of any given implementation. Moreover, the skilled person will be aware that features from different examples can be mixed as appropriate in any particular implementation, without limitation to the particular combinations described in the above examples. Accordingly, the scope of the present invention is defined by the appended claims and their equivalents.

Various preferred implementations are set out by way of example in the following numbered clauses:

1. A switching resistor having a low resistance state and a high resistance state, comprising a dielectric layer disposed between a first electrode and a second electrode, and a textured boundary surface between the first electrode and the dielectric layer, wherein the textured boundary surface acts to promote the formation of a conductive pathway in the dielectric layer between the first electrode and the second electrode.

2. The switching resistor of clause 1, wherein the textured boundary surface comprises a predetermined texture pattern.

3. The switching resistor of clause 2, wherein the predetermined texture pattern is provided as part of a manufacturing step of the switching resistor specifically to add the texture pattern.

4. The switching resistor of clause 1, wherein the textured boundary surface comprises random texturing.

5. The switching resistor of clause 4, wherein the random texturing is provided inherently as part of a manufacturing step of the switching resistor.

6. The switching resistor of any preceding clause, wherein the first electrode and second electrodes are formed of metal or silicon.

7. The switching resistor of any preceding clause, wherein the dielectric is an oxide of silicon ($SiO_x$)

8. The switching resistor of any preceding clause, wherein the dielectric layer is formed on the first electrode.

9. The switching resistor of any preceding clause, wherein the dielectric layer includes column structures extending from the textured boundary surface between the first electrode and the dielectric layer towards the second electrode.

10. The switching resistor of clause 9, wherein the textured boundary surface enhances formation of the column structures in the dielectric layer.

11. The switching resistor of clause 9 or 10, wherein at least one of the column structures acts to form said conductive pathway in response to the application of an electroforming voltage to the switching resistor.

12. The switching resistor of any of clauses 9 to 11, wherein boundaries between the column structures have a lower density than the surrounding regions of the dielectric material.

13. The switching resistor of any preceding clause, wherein electroforming of the switching resistor occurs at a voltage in the range −15 to −1 Volts, more particularly in the range −3 to −2 volts.

14. The switching resistor of any preceding clause, wherein setting of the switching resistor to the low resistance state occurs in the range −6 to −0.5 volts, more particularly in the range −1.1 to −0.9 volts.

15. The switching resistor of any preceding clause, wherein re-setting of the switching resistor to the high resistance state occurs in the range 0.5 to 6 volts, more particularly in the range 0.85 to −1.3 volts.

16. The switching resistor of any preceding clause, wherein the surface roughness is on a scale in the range 1-20 nm, more particularly in the range 2-10 nm, more particularly in the range 3-7 nm.

17. The switching resistor of clause 16, wherein the scale of the surface texturing, in a direction normal to the surface, is measured using one of the following parameters: a predetermined portion, k, of peak-to-peak variation, where $0.2 \le k \le 1$; a standard deviation; and a root-mean square value about a mean, median or mode level.

18. The switching resistor of any preceding clause, wherein the scale of the surface texturing, in a direction normal to the surface, is in the range of 0.1-15% of the thickness of the first electrode, more particularly in the range 1-5%.

19. The switching resistor of any preceding clause, wherein the scale of the surface texturing, in a direction normal to the surface, is in the range of 5-30% of the thickness of the dielectric layer, more particularly in the range 10-20%.

20. The switching resistor of any preceding clause, wherein the surface texturing occurs within a width, measured parallel to the boundary surface between the first electrode and the dielectric layer, of less than 60 nm, more particularly less than 40 nm, and more particularly within a width in the range 10 to 30 nm.

21. A method for making a switching resistor having a low resistance state and a high resistance state,
  forming a first electrode;
  forming a dielectric layer on the first electrode, with a textured boundary surface between the first electrode and the dielectric layer; and
  forming a second electrode on the dielectric layer;
  wherein the textured boundary surface acts to promote the formation of a conductive pathway in the dielectric layer between the first electrode and the second electrode.

22. The method of clause 21, further comprising forming a substrate, wherein the first electrode is formed on the substrate.

23. The method of clause 22, wherein the textured boundary surface is created by applying a texture to substrate.

24. The method of any of clauses 21 to 23, wherein the textured boundary surface is created by e-beam patterning.

25. The method of any of clauses 21 to 23, wherein the textured boundary surface is created by forming the first electrode by low-temperature sputtering.

26. The method of any of clauses 21 to 25, wherein the method is used to make the switching resistor of any of clauses 1 to 20.

27. A switching resistor having a low resistance state and a high resistance state, comprising a dielectric layer disposed between a lower electrode and an upper electrode,
  wherein a boundary surface structure is formed on a boundary surface between the dielectric layer and a first one of the lower or upper electrodes, said boundary surface structure comprising a pillar of the first one of the electrodes extending into a corresponding hole formed in the dielectric layer, the pillar and hole extending in a direction perpendicular to the dielectric layer, towards the second, other, one of the lower or upper electrodes;
  and wherein the boundary surface structure acts to promote the formation of a conductive pathway in the dielectric layer between boundary surface structure and the second one of the electrodes.

28. The switching resistor of clause 27, wherein the boundary surface structure is formed on a boundary surface between the dielectric layer and the upper electrode, the upper electrode being deposited on the dielectric layer.

29. The switching resistor of clause 27 or 28, wherein the extension of the first one of the electrodes into the hole is formed integrally with the first one of the electrodes.

30. The switching resistor of any of clauses 27 to 29, wherein the boundary surface structure has a width, measured parallel to the boundary surface between the first one of the electrodes and the dielectric layer, in the range of 1 to 60 nm, more particularly 2 to 30 nm, more particularly 4 to 20 nm.

31. The switching resistor of any of clauses 27 to 30, wherein the boundary surface structure has a thickness, measured perpendicular to the boundary surface between the first one of the electrodes and the dielectric layer, in the range of 20 to 80% of the thickness of the dielectric layer, more particularly in the range of 33 to 66% of the thickness of the dielectric layer.

32. The switching resistor of any of clauses 27 to 31, wherein the boundary surface structure has a thickness, measured perpendicular to the boundary surface between the first one of the electrodes and the dielectric layer, in the range of 5 to 100 nm, more particularly in the range of 10 to 50 nm, more particularly in the range of 15 to 25 nm.

33. The switching resistor of any of clauses 27 to 31, wherein the boundary surface structure has the shape of a cylindrical pillar, comprising an end wall interfacing with the dielectric layer, furthest from the first one of the electrodes, the end wall being parallel to the boundary surface between the first one of the electrodes and the dielectric layer, and a side wall interfacing with the dielectric layer, the side wall being perpendicular to the boundary surface between the first one of the electrodes and the dielectric layer, and extending around the periphery of the boundary surface structure.

34. A method for making a switching resistor having a low resistance state and a high resistance state,
  forming a lower electrode, a dielectric layer on the lower electrode, and an upper electrode on the dielectric layer;
  wherein said forming includes forming a boundary surface structure on a boundary surface between the dielectric layer and a first one of the lower or upper electrodes, said boundary surface structure comprising a pillar of the first one of the electrodes extending into a corresponding hole formed in the dielectric layer, the pillar and hole extending in a direction perpendicular to the dielectric layer, towards the second, other, one of the lower or upper electrodes;

and wherein the boundary surface structure acts to promote the formation of a conductive pathway in the dielectric layer between boundary surface structure and the second one of the electrodes.

35. The method of clause 34, wherein the boundary surface structure is formed by e-beam patterning.

36. The method of clause 34 or 35, wherein the boundary surface structure is formed by depositing the dielectric layer on the lower electrode, forming the holes in the dielectric layer, and depositing the upper electrode onto the dielectric layer.

37. The method of clause 34 or 35, wherein the boundary surface structure is formed by creating pillars on the lower electrode, and then depositing the dielectric layer onto the lower electrode.

38. A switching resistor including the features of any of clauses 1 to 20 in combination with the features of any of clauses 27 to 33.

References

1. R. Waser, M. Aono, Nature materials 6.11, 833-840 (2007).
2. A. C. Torrezan, J. P. Strachan, G. Medeiros-Ribeiro, and R. S. Williams, Nanotechnology, 22 (48), 485203 (2011).
3. H. Y. Chen, S. Yu, B. Gao, P. Huang, J. Kang, and H-SP Wong, IEEE International Electron Device Meeting (IEDM), 20.7.1-20.7.4 (2012).
4. S. H. Jo, T. Chang, I. Ebong, B. B. Bhadviya, P. Mazumder, W. Lu. Nano letters, 10.4, 1297-1301 (2010).
5. A. Mehonic, A. J. Kenyon, Frontiers in neuroscience, 10, 57 (2016).
6. J. Borghetti, G. S. Snider, P. J. Kuekes, J. J. Yang, D. R. Stewart, R. S. Williams, Nature, 464.7290, 873-876 (2010).
7. K. C. Chang, T. M. Tsai, T. C. Chang, H. H Wu, J. H. Chen, Y. E. Syu, G. W. Chang, T. J. Chu, G. R. Liu, Y. T. Su, M. C. Chen, IEEE Electron Device Letters, 34 (3), 399-401 (2013).
8. A. Mehonic, A. J. Kenyon, Defects at Oxide Surfaces, Springer International Publishing, 401-428 (2015).
9. A. Mehonic, S. Cueff, M. Wojdak, S. Hudziak, O. Jambois, C. Labbé, B. Garrido, R. Rizk, A. J. Kenyon, Journal of Applied Physics, 111, 074507 (2012).
10. A. Mehonic, M. Buckwell, L. Montesi, L. Garnett, S. Hudziak, S. Fearn, R. Chater, D. McPhail, A. J. Kenyon, Journal of Applied Physics. 117.12, 124505 (2015).
11. A. N. Mikhaylov, A. I. Belov, D. V. Guseinov, D. S. Korolev, I. N. Antonov, D. V. Efimovykh, S. V. Tikhov, A. P. Kasatkin, O. N. Gorshkov, D. I. Tetelbaum, E. G. Gryaznov, A. P. Yatmanov, Materials Science and Engineering B, 194, 48 (2015).
12. J. Yao, Z. Sun, L. Zhong, T. D. Natelson, J. M. Tour, Nano letters. 10, 4105 (2010).
13. G. Wang, Y. Yang, J. H. Lee, V. Abramova, H. Fei, G. Ruan, E. L. Thomas, J. M. Tour. Nano letters. 14(8), 4694-9 (2014).
14. X. Yan, Z. Zhou, B. Ding, J. Zhao, Y. Zhang Y, Journal of Materials Chemistry C, Advance Article, (2017). DOI: 10.1039/C6TC04261A
15. A. Hohl, T. Wieder, P. A. van Aken, T. E. Weirich, G. Denninger, M. Vidal, S. Oswald, C. Deneke, J. Mayer and H. Fuess, Journal of Non-Crystalline Solids, 320 (1), 255-280 (2003).
16. J. A. Thornton, Journal of Vacuum Science & Technology A: Vacuum, Surfaces, and Films, 4 (6), 3059-3065 (1986).
17. S. J. Pennycook, D. E. Jesson, Ultramicroscopy, 37, no. 1: 14-38 (1991).
18. A. Mehonic, M. Wojdak, S. Hudziak, R. Rizk, R, A. J. Kenyon, Nanotechnology, 23(45), 455201 (2012).
19. D. Gao, A. EI-Sayed, A. L. Shluger, Nanotechnology, 27, 505207 (2016).
20. A. Mehonic, M. Buckwell, L. Montesi, M. S. Munde, D. Gao, S. Hudziak, R. J. Chater, S. Fearn, D. McPhail, M. Bosman, A. L. Shluger, Advanced Materials 28.34: 7486-7493 (2016).

The invention claimed is:

1. A switching resistor having a low resistance state and a high resistance state, comprising a dielectric layer disposed between a first electrode and a second electrode, wherein the dielectric layer is an oxide of silicon, and a textured boundary surface between the first electrode and the dielectric layer, wherein the dielectric layer includes column structures extending from the textured boundary surface between the first electrode and the dielectric layer towards the second electrode, wherein the textured boundary surface is configured to promote the formation of a conductive pathway in the dielectric layer, at an edge of a column structure, between the first electrode and the second electrode for intrinsic resistance switching.

2. The switching resistor of claim 1, wherein the textured boundary surface comprises a predetermined texture pattern.

3. The switching resistor of claim 1, wherein the textured boundary surface comprises random texturing.

4. The switching resistor of claim 1, wherein the first electrode and second electrodes are formed of metal or silicon.

5. The switching resistor of claim 1, wherein the dielectric layer is formed on the first electrode.

6. The switching resistor of claim 1, wherein at least one of the column structures is configured to form said conductive pathway in response to the application of an electroforming voltage to the switching resistor.

7. The switching resistor of claim 6, wherein boundaries between the column structures have a lower density than the surrounding regions of the dielectric material.

8. The switching resistor of claim 1, wherein the surface roughness is on a scale in the range 1-20 nm, more particularly in the range 2-10 nm, more particularly in the range 3-7 nm.

9. The switching resistor of claim 8, wherein the scale of the surface texturing, in a direction normal to the surface, is measured using one of the following parameters: a predetermined portion, k, of peak-to-peak variation, where $0.2 \leq k \leq 1$; a standard deviation; and a root-mean square value about a mean, median or mode level.

10. The switching resistor of claim 1, wherein the scale of the surface texturing, in a direction normal to the surface, is in the range of 0.1-15% of the thickness of the first electrode, more particularly in the range 1-5%.

11. The switching resistor of claim 1, wherein the scale of the surface texturing, in a direction normal to the surface, is in the range of 5-30% of the thickness of the dielectric layer, more particularly in the range 10-20%.

12. The switching resistor of claim 1, wherein the surface texturing occurs within a width, measured parallel to the boundary surface between the first electrode and the dielectric layer, of less than 60 nm, more particularly less than 40 nm, and more particularly within a width in the range 10 to 30 nm.

13. A method of using the switching resistor of claim 1, comprising electroforming the switching resistor by applying an electroforming voltage in the range −15 to −1 Volts, more particularly in the range −3 to −2 volts.

14. The method of claim 13, comprising setting the switching resistor to the low resistance state by applying a switching voltage in the range −6 to −0.5 volts, more particularly in the range −1.1 to −0.9 volts.

15. The method of claim 13, comprising re-setting the switching resistor to the high resistance state by applying a re-setting voltage in the range 0.5 to 6 volts, more particularly in the range 0.85 to −1.3 volts.

16. A method of making a switching resistor having a low resistance state and a high resistance state, the method comprising:

forming a first electrode;

forming a dielectric layer on the first electrode, with a textured boundary surface between the first electrode and the dielectric layer, wherein the dielectric layer is an oxide of silicon; and forming a second electrode on the dielectric layer, and wherein the dielectric layer includes column structures extending from the textured boundary surface between the first electrode and the dielectric layer towards the second electrode; wherein the textured boundary surface is configured to promote the formation of a conductive pathway in the dielectric layer, at an edge of a column structure, between the first electrode and the second electrode providing intrinsic resistance switching.

17. The method of claim 16, further comprising forming a substrate, wherein the first electrode is formed on the substrate.

18. The method of claim 17, wherein the textured boundary surface is created by applying a texture to substrate.

19. The method of claim 16, wherein the textured boundary surface is created by e-beam patterning.

20. The method of claim 16, wherein the textured boundary surface is created by forming the first electrode by low-temperature sputtering.

* * * * *